(12) United States Patent
Büyükbas et al.

(10) Patent No.: US 8,173,912 B2
(45) Date of Patent: May 8, 2012

(54) HOUSING COMPRISING A DEVICE FOR FIXING AN ELECTRONIC COMPONENT

(75) Inventors: Turhan Büyükbas, Kirchenlamitz (DE); Jürgen Rietsch, Hof (DE); Helmut Karrer, Fürth (DE); Jürgen Henniger, Erlangen (DE); Matthias Gramann, Renchen (DE); Matthias Wieczorek, Neunkirchen am Sand (DE); Klaus Scharrer, Hohenstadt (DE); Peter Guth, Nürnberg (DE); Dirk Trodler, Nürnberg (DE)

(73) Assignee: Conti Temic Microelectronic GmbH (DE)

( * ) Notice: Subject to any disclaimer, the term of this patent is extended or adjusted under 35 U.S.C. 154(b) by 232 days.

(21) Appl. No.: 12/531,776

(22) PCT Filed: Mar. 19, 2008

(86) PCT No.: PCT/DE2008/000463
§ 371 (c)(1),
(2), (4) Date: Apr. 2, 2010

(87) PCT Pub. No.: WO2008/113336
PCT Pub. Date: Sep. 25, 2008

(65) Prior Publication Data
US 2010/0175921 A1    Jul. 15, 2010

(30) Foreign Application Priority Data
Mar. 19, 2007   (DE) .......................... 10 2007 013 696

(51) Int. Cl.
*H01R 13/502* (2006.01)

(52) U.S. Cl. .......................... 174/561; 174/563; 257/704
(58) Field of Classification Search .................. 257/704; 174/542, 561, 563
See application file for complete search history.

(56) References Cited

U.S. PATENT DOCUMENTS

| 4,390,220 A | * | 6/1983 | Benasutti ........................ 439/71 |
| 5,406,025 A | * | 4/1995 | Carlstedt .................... 174/17.08 |
| 5,473,510 A | * | 12/1995 | Dozier, II ........................ 361/719 |
| 5,949,649 A | * | 9/1999 | Bartlow ........................ 361/704 |
| 6,043,983 A | * | 3/2000 | Taylor et al. .................. 361/704 |

(Continued)

FOREIGN PATENT DOCUMENTS

DE   37 18 172 A1   12/1988

(Continued)

*Primary Examiner* — Hung Ngo
(74) *Attorney, Agent, or Firm* — RatnerPrestia

(57) ABSTRACT

A housing for retaining an electronic component, including a lid and a lower part made of synthetic material, wherein the lid is joined in a force-fit manner to the lower part by clamping geometry, and in order to affix the electronic component in position, the lid applies a specified force (F) to the electronic component after being joined to the lower part due to its design. Here, the lid is designed in such a manner that the force (F) applied lies within a specified force range (B), and that the clamping geometry comprises a groove on the lower part and a ridge on the lid which grips into the groove, wherein a clamp web on the lower part or on the lid is arranged in such a manner that the lid is removably clamped to the lower part after being joined to the lower part with a force (F) which acts parallel to the clamping force (KF).

8 Claims, 2 Drawing Sheets

U.S. PATENT DOCUMENTS

| | | | |
|---|---|---|---|
| 6,119,333 A * | 9/2000 | Marro | 29/825 |
| 6,891,730 B2 * | 5/2005 | Farassat | 361/769 |
| 6,979,782 B1 * | 12/2005 | Brodsky et al. | 174/535 |
| 7,186,912 B2 * | 3/2007 | Guan et al. | 174/50 |
| 7,586,302 B2 | 9/2009 | Choi et al. | |
| 2002/0053449 A1 * | 5/2002 | Carden et al. | 174/52.1 |
| 2002/0053453 A1 * | 5/2002 | Farnworth et al. | 174/52.1 |
| 2007/0284144 A1 * | 12/2007 | Too et al. | 174/520 |

FOREIGN PATENT DOCUMENTS

| | | |
|---|---|---|
| DE | 103 48 358 A1 | 5/2005 |
| DE | 11 2006 001 393 T5 | 4/2008 |
| JP | 9 326567 | 12/1997 |
| WO | WO 2007/004462 | 1/2007 |

* cited by examiner

HOUSING COMPRISING A DEVICE FOR FIXING AN ELECTRONIC COMPONENT

CROSS REFERENCE TO RELATED APPLICATIONS

This application is the U.S. national phase application of PCT International Application No. PCT/DE2008/000463, filed Mar. 19, 2008, which claims priority to German Patent Application No. 10 2007 013 696.1, filed Mar. 19, 2007, the contents of such applications being incorporated by reference herein.

BACKGROUND OF THE INVENTION

1. Field of the Invention

The invention relates to a housing with a device for affixing an electronic component.

2. Description of the Related Art

Electronic components, in particular sensors, are used in the field of measuring technology, general control technology and also in particular in automobile technology. For reasons of simplicity, electronic components will be referred to below as sensors, although this does not exclude other electronic components. In an engine or a gearbox, the sensors are frequently exposed to aggressive media such as gear oil, high temperature fluctuations and high levels of mechanical stress. Here, they record values such as pressures, engine speeds or length dimensions. For this purpose, it is generally necessary to precisely adjust the position of the sensor to the part to be sensed, and to maintain this position over the entire working life of the sensor. Furthermore, a specific level of force may not be exceeded when affixing the sensor in its retainer, since the sensor is frequently pressure-sensitive and can be damaged when an excessive level of force is applied.

For this purpose, the sensors are surrounded by a housing, wherein the housing comprises a lower part and a lid, with both preferably made of synthetic material. Generally, the sensors in the lower part are retained in such a manner that they will not tilt, and are subsequently covered with a lid free from clearance for mechanical affixation. The lower part and the lid are then joined together in a form-fit or force-fit manner, or by material connection.

To date, this has been achieved for example either in combination with a system consisting of a latch and latch indentation on the lower part and on the lid with subsequent caulking of both parts, using either a hot or cold method. Instead of caulking, the lid can also be joined to the lower part using welding, whether by means of ultrasound or laser welding. Furthermore, there are applications wherein the lower part and the lid are joined together after the sensor has been inserted into the lower part by means of overall insert moulding.

The disadvantage with the housing to date is that a relatively large number of processes are required in order to manufacture them: the insertion of the sensor into the lower part, the covering of the sensor and simultaneous affixation of the sensor by the lid, and the subsequent completion of the overall join between the lower part and the lid. Furthermore, following completion, the lower part and the lid are permanently joined to each other.

SUMMARY OF THE INVENTION

An object of the invention is thus to provide a housing of the type named in the introduction in such a manner that the sensor is retained in the housing over its entire working life in a stable position and with reliable functioning, wherein the join between the lid and the lower part of the housing remains permanently stable and is easy to manufacture.

A concept of the invention is to create the lid of the housing in such a manner that the lid lies pre-tensioned on the electronic component when mounted in such a manner that the force applied lies within a specified force range, and that in particular, a maximum force is not exceeded. As a result, the electronic component is affixed in a stable position while retaining its functionality, and additionally, the effects of any sensor height-related tolerances are offset by the arrangement of the sensor in the housing. Furthermore, the lid is joined to the lower part by means of a clamping geometry. The clamping geometry comprises a groove on the lower part and a ridge on the lid which grips into the groove, wherein a clamp web is arranged on the lower part of the lid in such a manner that following the connection with the lower part, the lid is clamped to the lower part with a clamping force which acts in parallel to the force applied to the electronic component. Advantageously, it is also possible as a result to remove the lid from the lower part again, for example for repair purposes.

In particular, the force with which the lid is attached to the electronic component lies between a minimum force which is at least necessary in order to affix the electronic component to the housing and a maximum force which may not be exceeded in order to secure the functionality of the electronic component.

The force with which the lid is attached to the electronic component is in particular adjustable by means of a specified elasticity module on the lid, or by means of a specified thickness profile on the lid. A combination of both features would also be feasible. The lid, and in general also the lower part, is preferably made of polyamide or another polymer. The elasticity module of the lid lies in particular within a range of between 3 GPA and 10 GPA. The thickness of the lid preferably fluctuates between 0.15 mm and 3.0 mm. It would also be feasible for the lid thickness to comprise a profile which tapers from the centre outwards, or vice-versa.

The profile of the lid is for example plane-parallel, plane-convex or concave-convex. One advantage of a lid profile form which is curved in the direction of the electronic component is that as a result, an additional pre-tensioning is achieved.

The clamping geometry by means of which the lid is joined to the lower part essentially comprises a groove, a ridge which grips into the groove, and a clamp web which is arranged on the groove or on the ridge, which creates the clamping force with which the lid and the lower part are joined together. Advantageously, the clamp web extends over the entire length of the groove or ridge in order to evenly distribute the clamping force. The clamp web may however also be shorter.

As a rule, the lid is pushed or joined onto the lower part at the side in such a manner that the ridge grips into the groove, wherein during the joining procedure, the clamping force created by the clamp web must be overcome. In particular, the front side of the clamp web, i.e. the side of the clamp web which lies at the front in the join direction, shows a tapering, essentially wedge-shaped run-out. As a result, the joining procedure is made easier, and additionally, this embodiment of the clamp web in particular acts in a self-locking manner when the lid is loosened from the lower part.

BRIEF DESCRIPTION OF THE DRAWINGS

Further advantages and features of the invention are given in the description below of an exemplary embodiment of the invention with reference to the drawings, in which.

DETAILED DESCRIPTION OF THE PREFERRED EMBODIMENTS

Figure 1:
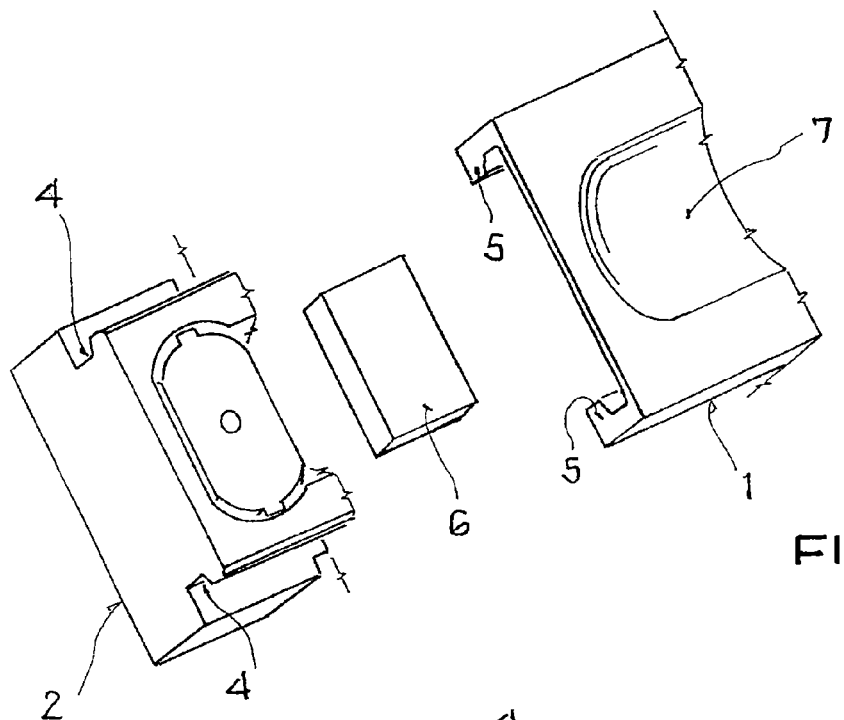
FIG. 1 shows an exploded view of the lid, sensor and lower side.

FIG. 1 shows an exploded view of a housing for retaining a sensor 6 with a lid 1 and a lower part 2. The lid 1 comprises a profile 7 which is curved, concave-convex or meniscus-shaped in the direction of the sensor 6.

Figure 2:
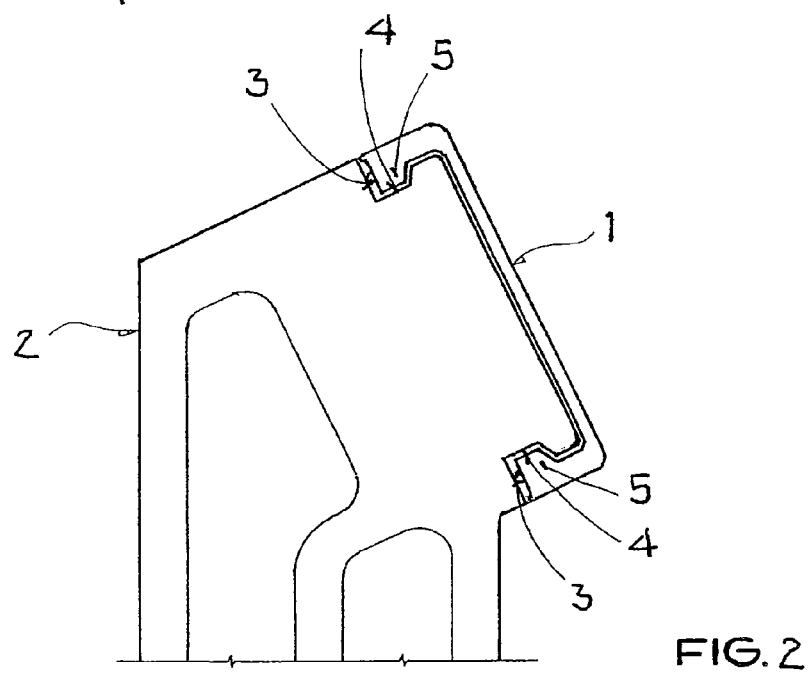
FIG. 2 shows a side view of a housing with lid mounted to the lower part.

FIG. 2 shows a side view of the housing shown in FIG. 1 with the lid 1 which has been joined, i.e. pushed, onto the lower part 2. The lid 1 applies a force F to the sensor 6 due to its profile 7, which lies between a minimum force Fmin which is required as a minimum in order to permanently affix the sensor 6 in the housing in a stable position, and a maximum force Fmax which may not be exceeded in order to secure the functionality of the sensor 6.

On the lower side of the ridge 5, which grips into the groove 4 of the lower part 2 of the housing, a clamp web 3 which is in particular strip-shaped is arranged, for example with a triangular profile. Advantageously, the clamp web 3 extends over the entire length of the ridge 5, but can if necessary be shorter. The ridge 5, the groove 4 and the clamp web 3 form the clamping geometry by means of which the lid 1 is joined in a force-fit manner to the lower part 2. The clamping force KF acts in parallel to the force F applied to the sensor 6. In particular, it is possible due to this type of clamping geometry to again remove the lid 1 from the lower part 2, for example for repair purposes, and to join it to the lower part 2 once more after the repair has been completed. The clamp web 3 could also be arranged on the groove 4 of the lower part 2. It would also be feasible to arrange one clamp web 3 on the lower part 2 and the lid 1 respectively.

Figure 3:
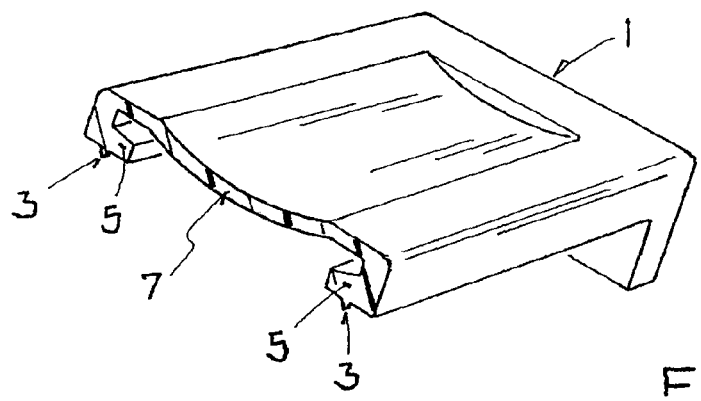
FIG. 3 shows a spatial view of a curved lid.

FIG. 3 shows a spatial view of a lid 1 with a concave-convex, in particular, meniscus-shaped profile 7, which runs parallel to the ridge 5 of the lid 1. It would also be feasible to arrange the profile 7 rotated by 90°, for example. It is also not necessary for the profile 7 to extend over the entire area of the lid 1.

Figure 4:
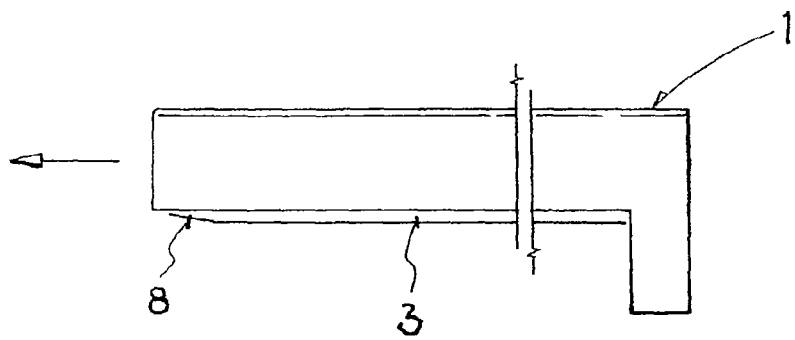
FIG. 4 shows a side view of a lid with a clamp web with run-out.

FIG. 4 shows a side view of the lid 1. The clamp web 3 here extends over the entire length of the ridge 5 on the lower side of the lid 1. The lid 1 is generally pushed or joined onto the lower part 2 in such a manner that the ridge 5 grips into the groove 4, wherein during the joining procedure, the clamping force KF which is created due to the clamp web 3 must be overcome. In particular, the front side of the clamp web 3 has a tapering, essentially wedge-shaped run-out 8 in the direction of the join. As a result, the joining procedure is made easier, and additionally, this embodiment of the clamp web 3 acts in particular in a self-locking manner when the lid is loosened from the lower part.

Figure 5:
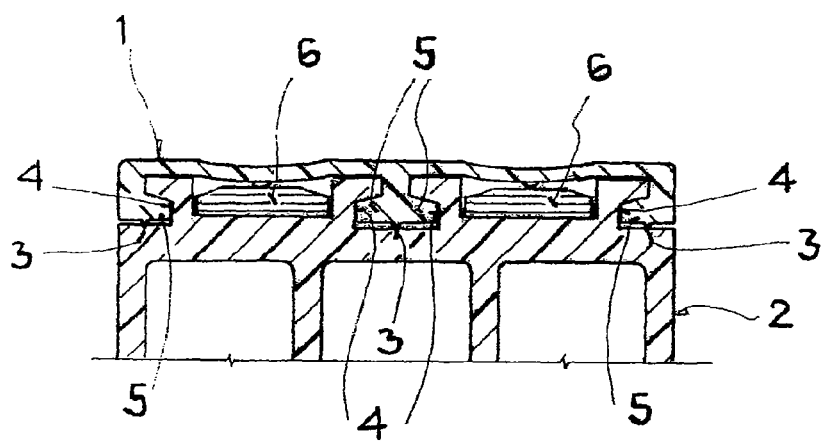
FIG. 5 shows an arrangement of two sensors in a lower part with two sensor retainers and a lid.

FIG. 5 shows an arrangement of two sensors 6 in a lower part 2 with a shared lid 1, which comprises between the two sensors 6 a ridge 5 which is in particular shaped on both sides, with at least one clamp web 3. Naturally, an arrangement of this type can also retain more than two sensors 6.

The invention claimed is:

1. A housing for retaining an electronic component, said housing comprising a lid and a lower part made of synthetic material,
    wherein the lid is joined in a force-fit manner to the lower part by a clamping geometry, such that the lid is configured to apply a force to the electronic component after being joined to the lower part in order to affix the electronic component in position within the housing, wherein the force lies within a specified force range,
    wherein the clamping geometry comprises a groove on the lower part and a ridge on the lid which grips into the groove,
    wherein a clamp web is arranged on the lower part or on the lid in such a manner that the lid is removably clamped to the lower part after being joined to the lower part with a force which acts parallel to the clamping force.

2. A housing according to claim 1, wherein the force range lies between a minimum force which is required to affix the electronic component in the housing and a maximum force in order to secure the functionality of the electronic component.

3. A housing according to claim 1, wherein the specified force can be adjusted by a specified elasticity module of the lid and/or by a specified profile of the lid.

4. A housing according to claim 3, wherein the profile of the lid is substantially planar.

5. A housing according to claim 3, wherein the profile of the lid is substantially convex.

6. A housing according to claim 3, wherein the profile of the lid is substantially concave and substantially convex.

7. A housing according to claim 1, wherein the clamp web extends over an entire length of the groove or the ridge.

8. A housing according to claim 1, wherein one end of the clamp web includes a wedge-shaped taper.

* * * * *